United States Patent [19]

Arnoux

[11] 4,118,787
[45] Oct. 3, 1978

[54] ANALOG MULTIPLIER ERROR CORRECTOR, NOTABLY FOR PRECISION WATTMETERS

[75] Inventor: Daniel Arnoux, Saint Germain en Laye, France

[73] Assignee: Societe Chauvin Arnoux, Paris, France

[21] Appl. No.: 766,481

[22] Filed: Feb. 7, 1977

[30] Foreign Application Priority Data

Feb. 11, 1976 [FR] France .................. 76 03766

[51] Int. Cl.² ............. G06G 7/161; G01R 11/32
[52] U.S. Cl. .................. 364/842; 307/229;
328/160; 324/142; 364/483; 364/862
[58] Field of Search ........... 235/194, 195, 196, 197;
307/229, 230; 328/160, 161; 324/140 R, 140 D,
141, 142; 364/844, 862, 483, 842

[56] References Cited

U.S. PATENT DOCUMENTS

| 3,466,460 | 9/1969 | Connolly | 235/194 X |
| 3,536,904 | 10/1970 | Jordan, Jr. et al. | 235/194 |
| 3,610,910 | 10/1971 | Udall | 235/194 |
| 3,712,977 | 1/1973 | Rice, Jr. | 235/194 X |
| 3,746,851 | 7/1973 | Gilbert | 235/194 |
| 3,959,724 | 5/1976 | Chana et al. | 324/142 |

Primary Examiner—Joseph F. Ruggiero

[57] ABSTRACT

An error correcting device for a multiplier of the time-division multiplication type comprising a modulator, a switch and a filter. Another switch is responsive to a time-base delivering periodically a zero signal to the modulator; a circuit memorizes and detects the difference between the product $xy$ vitiated by switching and shifting errors and the errors themselves. The memories are of the capacitor and amplifier type, and the subtraction is obtained through the opposite of the voltages of said capacitors. This device is applicable more particularly to high-frequency, wide-range precision wattmeters adapted for d.c. calibration.

9 Claims, 6 Drawing Figures

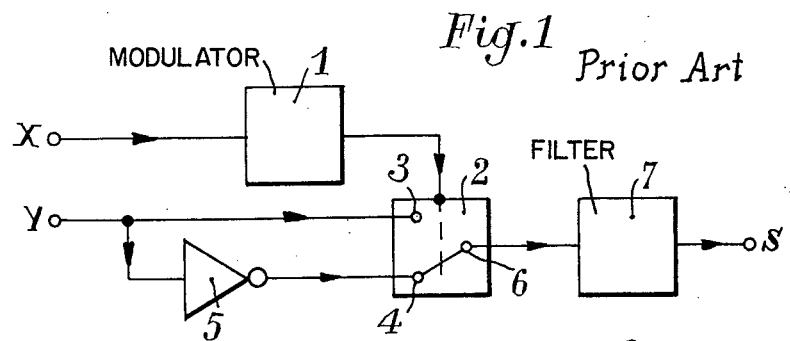
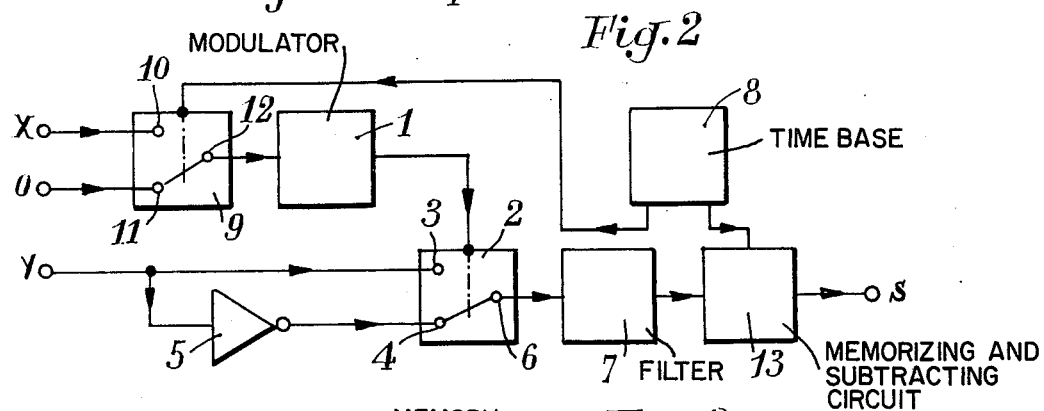
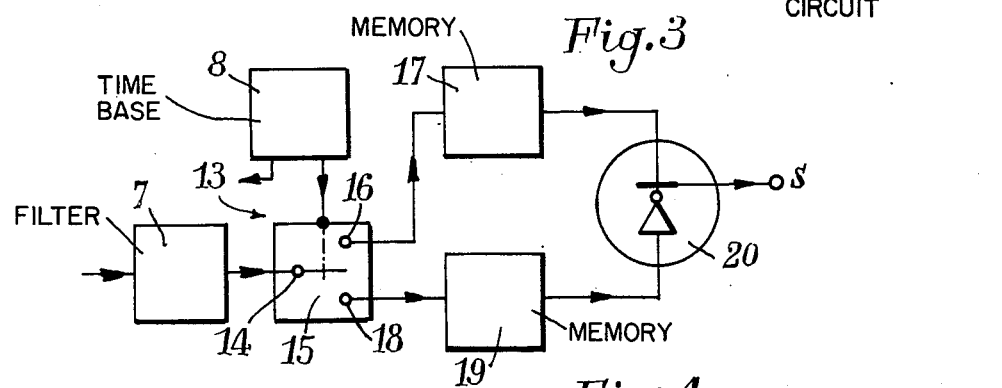
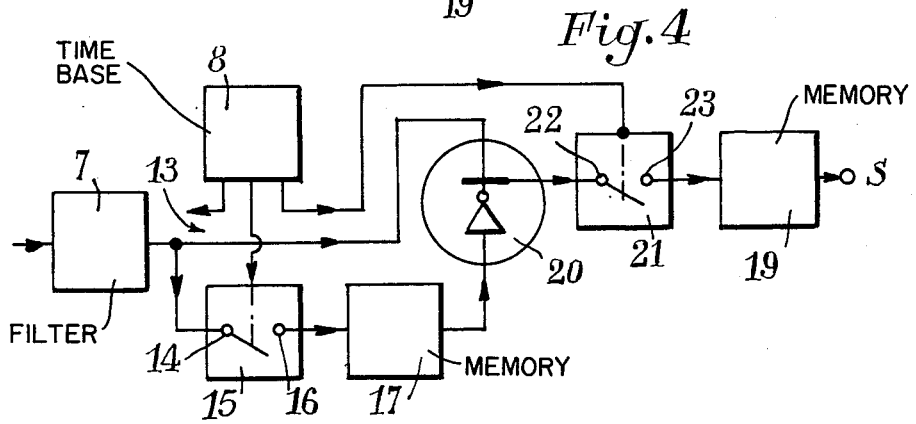

ANALOG MULTIPLIER ERROR CORRECTOR, NOTABLY FOR PRECISION WATTMETERS

BACKGROUND OF THE INVENTION

Field of the Invention

The present invention relates to an analog multiplier, notably for a precision electronic wattmeter operating according to the time-division multiplication method and comprising a modulator, a first switch and a low-pass filter.

The modulator is adapted to yield a cyclic ratio $\theta_x$ of a value proportional to a first analog input signal $x$ representative of a multiplier when this signal $x$ is fed to the modulator input.

Said first switch is responsive to the cyclic ratio $\theta_x$ and receives on a first input a second analog input signal $y$ representative of a multiplicand, and on another input the same signal but having its sign inverted, i.e. $-y$.

The filter is connected to the output of said first switch. Therefore, it receives during a time period $t_1$ the signal $+y$ and during a time period $t_2$ the signal $-y$, said times $t_1$ and $t_2$ being such that $$\theta_x = kx = \frac{t_1 - t_2}{t_1 + t_2},$$

with preferably $t_1 + t_2 =$ constant.

Thus, the filter output delivers a continuous signal substantially equal to the average value of the instantaneous scalar product of the two signals $x$ and $y$.

Multipliers of this character are incorporated notably in electronic wattmeters. For the sake of convenience, the following description will refer to a wattmeter, but it will readily occur to those conversant with the art that the analog multiplier according to this invention can be used with any other apparatus and appliance in which an analog multiplication of two input signals is required.

As a rule, these two input signals are alternating ones. They comprise as a rule a fundamental component of same frequency. Furthermore, these input signals can be phase-shifted to each other and have extremely distorted waveforms, possibly with a continuous component.

When signals at 400 Hz or even 2,000 Hz have to be processed with a relatively high degree of precision, of the order of, say, $10^{-5}$, the chopping performed by the modulator should have a high frequency of the order of 200 kHz.

However, it is obvious that at such high frequencies errors are caused by the switching action. Thus:
on the one hand, switching dispersions and delays, both when switching on and when switching off, introduce errors that are independent of the signal level, and
on the other hand, the rise and fall times of the signals constitute other sources of errors depending on the signal level, thus impairing linearity and reducing the range of practical applications.

Finally, in the case of continuous input signals, errors are caused by the shift voltage of amplifiers constituting compulsory components of such electronic wattmeters. Now these shift errors could be minimized by using chopping amplifiers or choppers, but the cost of chopping amplifiers is considerably higher than that of integrated-circuit operational amplifiers.

While a wattmeter can operate continuously without any error increment, it is possible to calibrate the instrument continuously, which constitutes an important feature, since accurate d.c. sources are more easily obtained and it is no more necessary to take into consideration possible phase shifts or waveform distortions.

SUMMARY OF THE INVENTION

It is the essential object of the present invention to provide a wattmeter utilizing the time-division multiplication method and capable of operating accurately through a wide range of measurements, both at high frequencies and with time-quadrature or distorted signals, or even with continuous signals.

This invention is characterised in that it contemplates the addition of a low-frequency time-base the pulses of which are fed to the control terminal of a second switch in order to switch over in a first time a first input receiving the first input signal $x$ and in a second time another input receiving a zero reference input signal. The output of this second switch is connected to the input of the modulator.

Further means are provided for memorizing the output signals delivered sequentially by the filter at the end of the first and second time periods, and also for continuously calculating the difference between these two output signals.

By virtue of the additional information thus received by said switch, the filter can yield successively firstly the input signal product $xy$ vitiated by the above-mentioned errors, and secondly the product of one of these signals by a zero signal, and then calculate the difference between these two previously memorized results, in order to obtain an error-free signal.

In a preferred embodiment of this invention, at the end of the second time period a third switch controlled by said time-base feeds to a first memory the filter output signal corresponding to the error in the product $y \cdot$ O and, at the end of the first time period, a fourth switch introduces into a second memory the output of the subtraction device having its input connected the one to the filter output and the other to the first memory output. Thus, the desired result is constantly available at the output of said second memory.

In said preferred embodiment, analog memories of the type comprising a capacitor associated with an amplifier are used, while the subtraction device consists of a fifth switch capable of opposing the capacitor voltages of said first and second memories to each other during the end of the first time period.

Details of the foregoing objects and of the invention, as well as other objects thereof, are set forth in the following specification and illustrated in the accompanying diagrammatic drawings comprising various embodiments thereof.

BRIEF DESCRIPTION OF THE DRAWINGS

FIG. 1 is a block diagram of a multiplier utilizing the known time-division multiplication method.

FIG. 2 illustrates the same block diagram but modified according to this invention for correcting the multiplier errors.

FIG. 3 illustrates the details of a first arrangement of the memorizing and subtraction means utilized in the arrangement of FIG. 2.

FIG. 4 is a similar diagram showing the details of a second arrangement of memorizing and subtraction means utilizing in the arrangement of FIG. 2.

DESCRIPTION OF THE PREFERRED EMBODIMENTS

Figure 5:
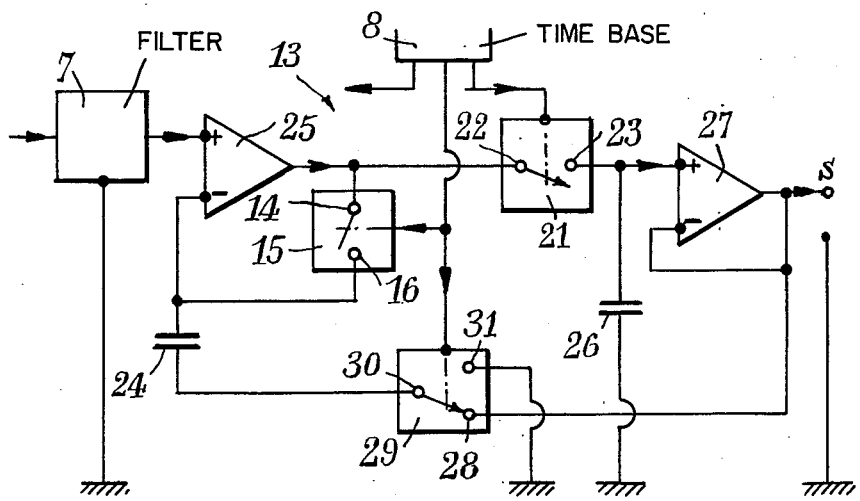
FIG. 5 illustrates a preferred embodiment of the device according to FIG. 3.

In FIG. 1, there is shown at 1 a modulator receiving a first analog input signal $x$ representing the multiplier. This modulator generates rectangular or square wave signals having a constant amplitude and a time period varying as a function of the instantaneous value of the first input signal $x$.

Let $t_1$ be the duration of a square wave, and $t_1 + t_2$ the cycle, at a given moment, of these square wave signals. Therefore, and preferably, $t_1 + t_2 =$ constant, and $$\frac{t_1 - t_2}{t_1 + t_2} = kx.$$

This ratio $$\frac{t_1 - t_2}{t_1 + t_2}$$

is called cyclic ratio $\theta x$. It is zero when $x = O$ and may assume positive or negative values according to the sign of $x$.

These square wave signals control a first switch 2 receiving at a first input 3 a second analog input signal $y$ corresponding to the multiplicand, and at a second input 4 the same signal but with another sign, that is, $-y$, through an inverter 5 receiving said signal $y$.

The output 6 of this first switch controls a filter 7 delivering at its output S, in the known manner, the desired signal equal to the average value of the instantaneous scalar product of signals $y$ and $x$.

In FIG. 2, the same components 1 to 7 are reproduced, but with the addition of a time-base 8 of relatively low frequency, of the order of 1 Hz, having a first output controlling a second switch 9 in order to switch in a first time a first input 10 receiving the first input signal $x$, and in a second time a second input 11 receiving a zero reference signal. The output 12 of this second switch 9 is coupled to the input of said modulator. The filter output is fed to memorizing and subtraction circuits 13 controlled by a second output of time-base 8.

This device operates as follows:

During the first time period, as defined by the time-base 8, the modulator receives at its input the first input signal $x$ and the filter delivers as before the average value of product $xy$ vitiated by the switching and shifting errors. Considering the time constant of the filter, this value is obtained with precision only at the end of this first time period. At this moment, the second output of time-base 8 controls the memorization of this value in one of the memories of circuits 13.

During the second time period, substantially equal to the first one, the modulator receives at its input a zero reference signal. Therefore, it should develop a cyclic ratio such that $t_1 = t_2$. If the first switch operated perfectly, it would therefore deliver to the filter a signal of which the average value would be zero. Yet in actual practice during this second time period the filter receives the constant errors from the modulator and from the switch, together with errors depending on the level of $y$, and the shifting errors caused by deviations.

At the end of the second time period, the second output of time-base 8 controls the memorization of the total error received from the filter into another memory of circuits 13.

On the other hand, said circuits 13 comprise a subtractor receiving the erroneous product $xy$ as well as the total error, and delivers at its output S the product $xy$ free of the aforesaid errors.

FIG. 3 illustrates the details of a first arrangement of circuits 13. The output of filter 7 is connected to the input 14 of a third switch 15. A first output 16 of this third switch is connected to the input of a first memory 17. A second output 18 of third switch 15 is fed to the input of a second memory 19. The outputs of these memories are coupled to a subtractor 20. The control terminal of this third switch 15 is connected to the second output of time-bae 8 in order to switch the first output 16 at the end of the first time period and the second output 18 at the end of the second time period. Said subtractor 20 will thus constantly calculate the difference between the content of the first memory 17 representing the erroneous product $xy$ and that of the second memory 19 representing the total error, in order to deliver the desired signal at S.

In a preferred arrangement of circuits 13, as illustrated in FIG. 4, the output of filter 7 is coupled to the input 14 of third switch 15 having its output 16 coupled to a first memory 17. Subtractor 20 has one input coupled to the output of filter 7 and the other input coupled to the output of the first memory 17. A fourth switch 21 has its input 22 coupled to the output of subtractor 20 and its output 23 coupled to the input of a second memory 19. The third switch 15 is actuated by the second output of time-base 8 at the end of the second time period, in order to memorize the total error. Said fourth switch 21 is actuated by a third output of said time-base 8 at the end of the first time period when the erroneous product $xy$ is fed to one of the subtractor inputs, so as to feed into said second memory 19 this product from which the error has been subtracted. Thus, the desired signal appears permanently at S.

FIG. 5 illustrates a preferred embodiment of circuits 13 in conjunction with the arrangement shown in FIG. 4. The first memory consists of a capacitor 24 associated with an amplifier 25 having its negative input coupled to a first terminal of said capacitor and its positive input coupled to the output of filter 7. The first terminal of said capacitor 24 is also coupled to the output 16 of said third switch 15 having its input 14 connected on the one hand to the output of amplifier 25 and on the other hand to the input 22 of the fourth switch 21. The second memory 19 consists of a capacitor 26 associated with an amplifier 27. A first terminal of this capacitor 26 is coupled on the one hand to the positive input of amplifier 27 and on the other hand to the output 23 of said fourth switch 21. The output S of amplifier 27 is coupled on the one hand to the negative input of said amplifier and on the other hand to a first output 28 of a fifth switch 29 having its input 30 coupled to the second terminal of capacitor 24. A reference terminal common to said filter 7 and to the wattmeter output S designated by the ground symbol is connected to the second terminal of capacitor 26 and also to the second output 31 of said fifth switch 29.

Figure 6:
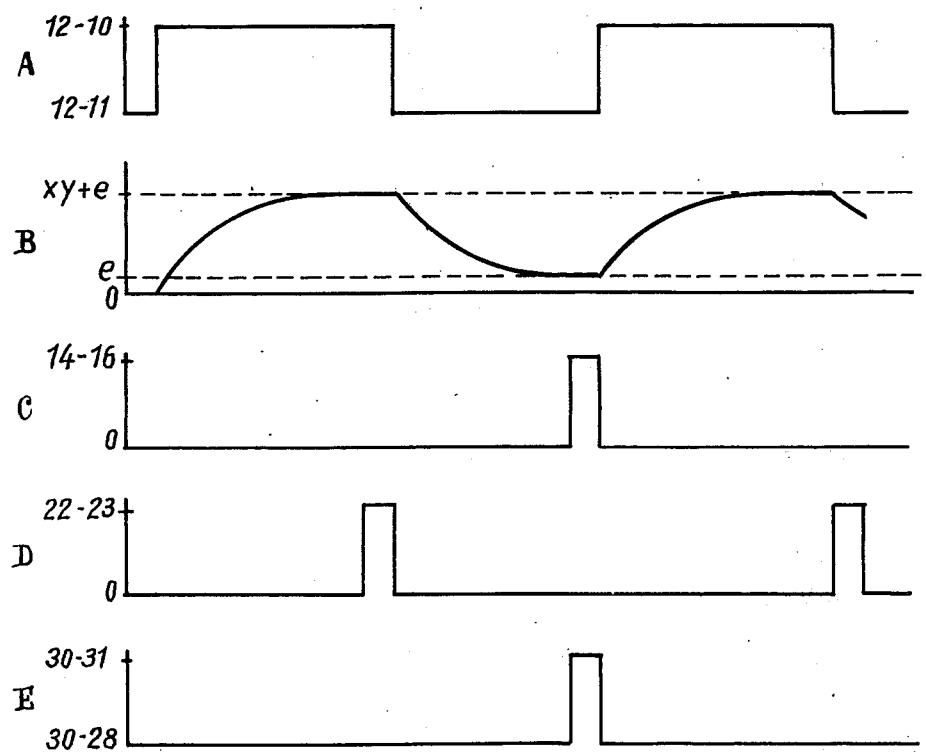
FIG. 6 is a waveform diagram illustrating the mode of operation of the error corrector according to this invention.

The mode of operation of this device is clearly illustrated by the diagram of FIG. 6.

The reference letter A designates the diagram of the second switch 9 of FIG. 2. During a first time period, the terminals 10-12 are coupled and during a second time period terminals 11-10 are coupled. The diagram of the first switch 2, operating at a much faster rate, has been omitted.

B is the diagrammatic illustration of the filter output changing gradually during the first time period from value O to value $xy + e$, in which $e$ denotes the global error. Then, during the second time, the filter output resumes its value $e$ approximating zero.

In C, the third switch 15 has its terminals 14-16 coupled during the end of the second time period, when the filter output has said value $e$.

In D, the fourth switch 21 has its terminals 22-23 coupled during the end portion of the first time period, when the value of the filter output is $xy + e$.

In E, the fifth switch 29 has its contacts 31-30 coupled during the end portion of the first time period, the other connection 30-28 being obtained during the remaining time. Thus, at the end of the second time, capacitor 24 is charged at said value $e$ due to the unit gain amplifier 25. At the end of the next first time period, capacitor 26 is also charged at value $xy + e$ of the filter output, from which the value $e$ of capacitor 24 is subtracted, due to the presence of amplifier 25 having at that time a high gain.

Since the memories are refreshened at each cycle, the desired value will be available permanently at S and follows the fluctuations of $x$ and $y$.

Of course, this invention should not be construed as being strictly limited to the specific form of embodiment described hereinabove with reference to the attached drawing. Thus, digit memories may be used, and the subtraction may be performed by an up-and-down counter.

It would also be possible to couple a switch similar to switch 9 to the input $y$, in order to correct the error of inverter 5, but in this case it is much simpler to correct directly the possible shifting of this inverter.

The device according to this invention may be used in all apparatus requiring the calculation of the product of two signals by the analog method. It is applicable more particularly to precision electronic wattmeters operating according to the time-division multiplication method.

Having described the invention, what is claimed as new is:

1. Error correcting device for an analog multiplier utilizing the time-division multiplication method and comprising a modulator, a first switch and a low-pass filter, said modulator being adapted to generate a high-frequency square wave signal of which the cyclic ratio is proportional to a first analog input signal when said first input signal is fed to the input of said modulator, said first switch being responsive to said cyclic ratio and receiving on a first input a second analog input signal and on a second input said second input signal but having its sign changed, said filter being coupled to the output of said switch and delivering a continuous output signal substantially equal to the average value of the instantaneous scalar product of said first and second input signals, wherein a low-frequency time-base is provided for delivering pulses to the control terminal of a second switch in order to switch during a first time period a first input receiving the first input signal, and in a second time period a second input receiving a zero reference signal, the output of said switch being coupled to the input of said modulator, means being provided for memorizing the output signals delivered by said filter at the end of said first and second time periods and calculating the difference between said two output signals.

2. Correcting device as recited in claim 1, wherein said means for memorizing said output signals and calculating said difference comprise:
    a third switch having an input coupled to the filter output, a control terminal coupled to another output of said time-base, a first output switched on at the end portion of said first time period, and a second output switched on at the end portion of said second time period;
    first and second memories having inputs each coupled to one output of said third switch;
    a subtraction device having two inputs coupled to two outputs, respectively, of said first and second memories, an output of said subtraction device delivering the desired signal.

3. Device as recited in claim 1, wherein said means for memorizing said output signals and calculating said difference comprise:
    a third switch having an input coupled to the filter output, a control terminal coupled to a second output of said time-base, and an output switched on at the end of one of the time periods;
    a first memory having an input coupled to the output of said third switch;
    a subtraction device having one input connected to the filter output and another input coupled to an output of said first memory;
    a fourth switch having an input connected to an output of said subtracting device, a control terminal coupled to a third output of said time-base, and an output switched on at the end of said other time period;
    a second memory having an input coupled to the output of said fourth switch and an output adapted to deliver the desired signal.

4. Device as recited in claim 3, wherein said second output of said time-base is adapted to deliver a control signal to said third switch at the end of said second time period.

5. Device as recited in claim 2, wherein said memories are analog memories of the type comprising a capacitor associated with an amplifier.

6. Device as recited in claim 3, wherein said memories are analog memories of the type comprising a capacitor associated with an amplifier.

7. Device as recited in claim 5, wherein said subtraction device consists of a fifth switch adapted to oppose the capacitor voltages of said first and second memories to each other during the end portion of the first time period.

8. Device as recited in claim 6, wherein said subtraction device consists of a fifth switch adapted to oppose the capacitor voltages of said first and second memories to each other during the end portion of said first time period.

9. Device as recited in claim 7, wherein each memory amplifier has a positive input, a negative input and an output, said fifth switch has first and second outputs, said filter output being coupled to the positive input of said first memory amplifier, the negative input of said amplifier being coupled on the one hand to a first terminal of the first memory capacitor and on the other hand to the output of said third switch, the output of said amplifier being coupled on the one hand to the input of said third switch and on the other hand to the input of said fourth switch, the output of said fourth switch being coupled on the one hand to a first terminal of second memory capacitor and on the other hand to the positive input of the amplifier of said memory, the output of said amplifier, constituting the output terminal of the multiplier, being coupled on the one hand to the negative input of said amplifier and on the other hand to the first output of said fifth switch, the input of said switch being connected to the second terminal of the first memory capacitor, one reference terminal common to said filter and to the output of a wattmeter being also coupled to the second terminal of said second memory capacitor which is switched over during at least the end portion of said second time period but not switched over during the end portion of the second time period, the switching over of said first output of said switch being complementary to that of said second output.

* * * * *